(12) United States Patent
Nicolas et al.

(10) Patent No.: US 8,232,836 B2
(45) Date of Patent: Jul. 31, 2012

(54) INTEGRATED CIRCUIT INCLUDING A LARGE NUMBER OF IDENTICAL ELEMENTARY CIRCUITS POWERED IN PARALLEL

(75) Inventors: Jean-Alain Nicolas, Grenoble (FR); Richard Morisson, Grenoble (FR)

(73) Assignee: E2V Semiconductors (FR)

( * ) Notice: Subject to any disclaimer, the term of this patent is extended or adjusted under 35 U.S.C. 154(b) by 58 days.

(21) Appl. No.: 12/866,043

(22) PCT Filed: Jan. 28, 2009

(86) PCT No.: PCT/EP2009/050945
§ 371 (c)(1),
(2), (4) Date: Sep. 10, 2010

(87) PCT Pub. No.: WO2009/098153
PCT Pub. Date: Aug. 13, 2009

(65) Prior Publication Data
US 2011/0012673 A1    Jan. 20, 2011

(30) Foreign Application Priority Data

Feb. 8, 2008 (FR) ...................................... 08 00678

(51) Int. Cl.
*H01L 25/00* (2006.01)
(52) U.S. Cl. ......................................................... 327/565
(58) Field of Classification Search .................. 327/564, 327/565, 566
See application file for complete search history.

(56) References Cited

U.S. PATENT DOCUMENTS

| | | | | |
|---|---|---|---|---|
| 6,747,509 | B2* | 6/2004 | Horiguchi et al. | 327/544 |
| 7,256,645 | B2* | 8/2007 | Pineda De Gyvez et al. | 327/551 |
| 7,557,639 | B2* | 7/2009 | Onda | 327/534 |
| 7,610,498 | B2* | 10/2009 | Sutardja | 713/320 |
| 2006/0125672 | A1 | 6/2006 | Budzelaar | |
| 2007/0040719 | A1 | 2/2007 | Kim et al. | |
| 2007/0216564 | A1 | 9/2007 | Koseki | |

OTHER PUBLICATIONS

International Search Report of Application No. PCT/EP2009/050945 mailed Mar. 30, 2009.

* cited by examiner

*Primary Examiner* — Jeffrey Zweizig
(74) *Attorney, Agent, or Firm* — Lowe Hauptman Ham & Berner, LLP

(57) ABSTRACT

The invention relates to an integrated circuit comprising a succession of N identical elementary circuits ($CE_1$, $CE_2$, ... $CE_N$), juxtaposed in the order of their rank j varying from 1 to N, N being at least equal to 50, and all having to receive two reference potentials Vref and V0 supplied by two conductors. An upstream input of the second conductor is situated geographically on the side of the rank 1 of the succession of juxtaposed circuits, and an upstream input of the first conductor is situated geographically on the side of the rank N of the succession of juxtaposed circuits. This reduces the error in the potential difference applied to the elementary circuits all along the succession, an error that originates from the non-zero resistance of the conductors. The integrated circuit is applicable to analog-digital converters or digital-analog converters with high resolution.

18 Claims, 6 Drawing Sheets

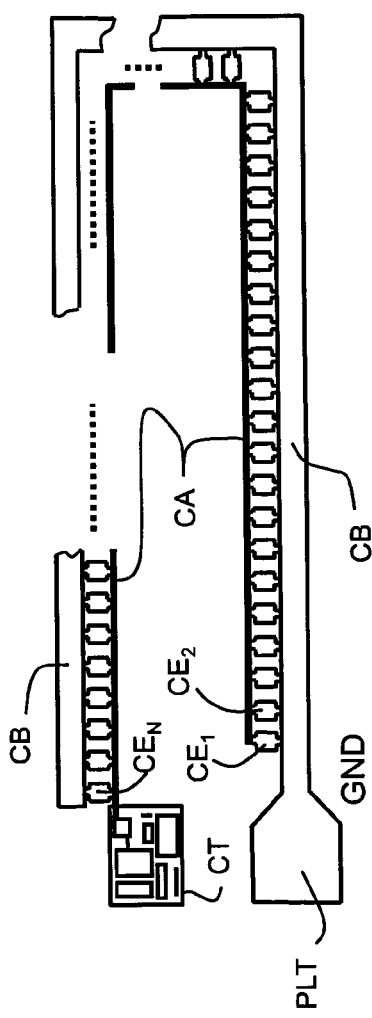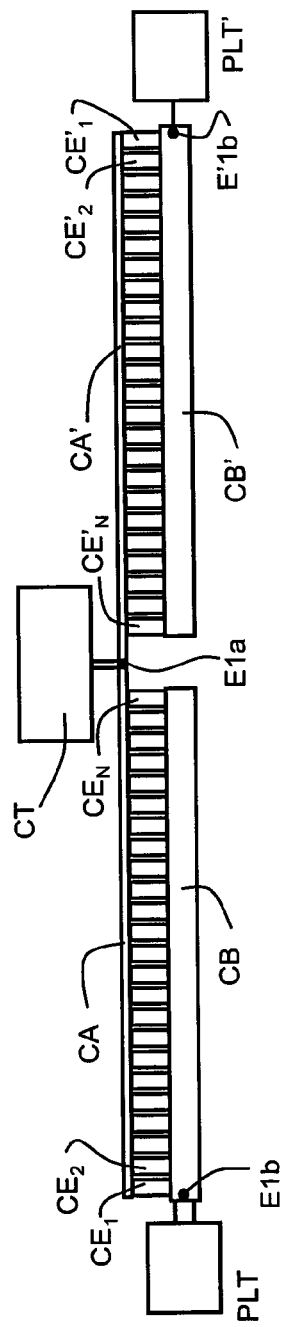

INTEGRATED CIRCUIT INCLUDING A LARGE NUMBER OF IDENTICAL ELEMENTARY CIRCUITS POWERED IN PARALLEL

RELATED APPLICATIONS

The present application is based on International Application Number PCT/EP2009/050945 filed Jan. 28, 2009, and claims priority from French Application Number 0800678, filed Feb. 8, 2008, the disclosures of which are hereby incorporated by reference herein in their entirety.

FIELD OF THE INVENTION

The invention relates to integrated circuits comprising a large number of identical elementary circuits which must receive in parallel identical reference voltages from one elementary circuit to the other.

BACKGROUND OF THE INVENTION

A typical envisaged application is that of analog-digital converters with high resolution, typically converters of 12 or 14 bits the structure of which is highly parallel in order to make it possible to perform a very rapid conversion. The converters of the flash type, for example, have a highly parallel structure in the sense that very many individual voltage comparators simultaneously carry out a comparison operation between an input voltage and various reference voltages. These comparators can each use one or more current sources and all the current sources must be perfectly identical with one another otherwise the result of the conversion is skewed. In an example of a converter with 14-bit resolution, there may be more than three hundred juxtaposed current sources which must all deliver strictly identical currents. To generate these currents, each source comprises, for example, a transistor which receives two reference potentials; one of the potentials is a bias potential of the base, the other is a power supply potential (for example a ground potential) to which the emitter or the source of the transistor is connected, directly or via an emitter or source resistance. In order for all the currents generated by these sources to be strictly identical, all the transistors and their resistances must be identical and they must also all receive the same bias potential and the same power supply potential.

In these structures with a large number of identical elementary circuits that must all receive in parallel one and the same potential, whether it be a high power supply potential or a low power supply potential, or a reference potential, or a potential to be measured, a difficulty is encountered which is associated with the fact that the voltage-supply conductors do not have an infinite conductivity but a conductivity that is limited by technological factors; the identical elementary circuits each consume a current which flows in this voltage-supply conductor; a voltage drop occurs in this conductor in proportion to the current consumed by the elementary circuits so that the elementary circuits receive different voltages depending on whether they are placed closer to or further from an upstream end of the conductor. "Large number" means a number at least equal to twenty and preferably at least fifty. The identical voltages are reference voltages which may, optionally but not necessarily, be voltages for powering the integrated circuit.

The voltage drop phenomenon is explained in FIG. 1 in the exemplary case of N elementary circuits $CE_1$, $CE_2$, ... $CE_j$, ... $CE_N$ connected between a bias conductor CA conveying a reference potential Vref and a ground conductor CB conveying a power supply potential V0 equal to 0 (ground potential). It is supposed that the elementary circuits each consume a current ia originating from the bias conductor and that they each return a current ib to the ground conductor. In the example of an elementary circuit that is a current source formed by a bipolar transistor, the current ia is the current consumed by the base of the transistor, and the current ib is the emitter current. The collector is used, for example, to draw a current ic=ia+ib from a differential pair (not shown) used in a voltage or current comparator associated with each elementary circuit. It is assumed that the ground conductor and the power supply conductor both have a specific non-zero resistivity, such that the resistance of the conductor between two adjacent elementary circuits $CE_j$ and $CE_{j+1}$, of rank j and j+1, spaced at a pitch d has a value Ra for the first conductor CA and a value Rb for the second conductor CB.

For the conductor CA transporting the potential Vref, it is also considered, in order to simplify the calculations, that there is a resistance Ra between the circuit which generates the voltage Vref and the first elementary circuit $CE_1$. For the ground conductor CB, it is considered also that there is a resistance Rb between the true ground GND and the first elementary circuit $CE_1$.

In this situation, it is easy to show that the last section of resistance RA of the conductor CA produces a voltage drop Ra.ia, that the penultimate produces a voltage drop 2.Ra.ia, etc. It can therefore be shown by the calculation that the power supply voltage that is really applied to the head of the elementary circuit $CE_j$ of rank j is not Vref but V'ref(j)=Vref−Ra.ia.j.(2N+1−j)/2, N being the total number of circuits.

Similarly, there is a voltage drop in the conductor CB, so that the foot of the elementary circuit $CE_j$ of rank j is not connected to the zero potential of the ground but rather to a potential Rb.ib.j.(2N+1−j)/2.

The potential difference V'ref(j)−V'0(j) then applied between the head and the foot of an elementary circuit of rank j is therefore $$V\text{ref}(j)-V\text{'0}(j)=V\text{ref}-(Ra.ia+Rb.ib).j.(2N+1-j)/2.$$

The difference relative to Vref increases as N increases and this difference reaches N.(N+1).(Ra.ia+Rb.in)/2 for the elementary circuit of rank j. If N is more than 100, it is seen that the error on the potential difference applied to the circuit of rank N is 10 000 times the voltage drop in an elementary section traveled by an elementary current, of the conductors CA and CB. If N is equal to 300, it is almost 100 000 times this drop. Even if the elementary voltage drop is very low, the error becomes considerable when N reaches one or several hundreds.

To make the applied potential difference as close as possible to Vref, the conventional solution is therefore to reduce as much as possible the value of the resistances Ra and Rb. Use is made of conductors CA and CB made of highly conductive material (aluminum or copper preferably) that are sufficiently thick (but with the constraints of the technology used), and sufficiently wide (but with all the more space requirement).

FIG. 2 shows a realistic physical layout of such an integrated circuit; the reference potential Vref is produced by a voltage-generation circuit CT which forms part of the integrated circuit and which is placed at the end of the succession of elementary circuits. The power supply potential V0 is that of the ground and can be supplied by an external power supply land PLT of the integrated circuit.

It would also be possible to supply each individual voltage to the elementary circuits from a central conductor which spreads out in successive branches organized so that the path from the reference potential (Vref or V0) has the same resistance to each of the circuits. But the space requirement that would result from such a tree structure is very large if there are several hundreds of circuits to be powered.

SUMMARY OF THE INVENTION

The invention proposes a solution to make the potential difference applied between the head and the foot of each of the juxtaposed elementary circuits more uniform without unreasonably increasing the space requirement of the structure.

The invention proposes an integrated circuit comprising a succession of N identical elementary circuits, juxtaposed in the order of their rank j varying from 1 to N, N being at least equal to 20 and preferably greater than 50, all connected to a first conductor which is connected, at a point called upstream input of the first conductor, to a first reference potential and which extends from this upstream input along the succession of elementary circuits, and all furthermore connected to a second conductor which is connected, at a point called upstream input of the second conductor, to a second reference potential, and which extends from this upstream input along the succession of elementary circuits, characterized in that the upstream input of the second conductor is situated geographically on the side of the rank 1 of the succession of juxtaposed circuits, and the upstream input of the first conductor is situated geographically on the side of the rank N of the succession of juxtaposed circuits.

In other words, if the elementary circuits are identified by their rank j from 1 to N along the succession, the second conductor supplies the second reference potential beginning with the elementary circuit of rank 1, and extending progressively to the other circuits in the order of the succession of ranks 1 to N, while the first conductor supplies the first reference potential beginning with the elementary circuit of rank N and then extending progressively to the others in the reverse order of the succession.

It has been found that, by applying the two reference potentials, Vref and ground for example, on either side of the succession and not on the same side, the voltage difference between the elementary circuit that receives the lowest potential difference and that which receives the highest was reduced (without being eliminated). There is a partial compensation for a voltage drop on one conductor by the voltage drop on the other.

Moreover, if the current is drawn by the head of the elementary circuit is different from the current ib supplied by the foot, an arrangement is made preferably to have an elementary resistance between two adjacent elementary circuits that is higher for the conductor supporting the smallest current and lower for the conductor supporting the lowest current. The choice is made preferably so as to achieve equality $Ra.ia=Rb.ib$.

In particular, if the elementary circuit is a transistor, the first conductor applying a reference potential to the base, and the second conductor being used to divert the emitter current to a ground, a section resistance is then chosen that is between 20 and 500 times higher (preferably between 100 and 250 times) for the conductor that is connected to the bases than for the conductor that is connected to the emitters. The ratio chosen is if possible close to the gain in beta current (collector current/base current) of the transistors; this beta gain may vary, depending on the technology employed, between a few tens and a few hundreds of units, or even more; conventionally it is between 100 and 250.

This difference in elementary resistances is obtained by varying the materials, their thicknesses and their widths.

It will be noted that the choice of elementary resistances that are different but in the inverse ratio to the currents ia and ib makes it possible for only one of the power supply conductors to have a relatively large width rather than both; this makes it possible to save space relative to a layout like that of FIG. 2.

According to an enhancement, it is also possible to provide that the conductor which supports the highest current has an inconstant elementary section resistance which increases from its upstream end (connected to ground for example). For this, provision is preferably made for the width of the conductor to reduce progressively, continuously or by stages from its upstream input. The law of decrease comes as close as possible to the function $(N-j+1)/j$, as a function of the rank j of the elementary section of conductor that connects the elementary circuits of rank j−1 and j.

If the elementary circuit is made up of MOS transistors the gates of which must receive the reference voltage, it is preferable to connect to the downstream end of the first conductor (opposite to the upstream input) a current source which artificially creates a progressive voltage drop in the first conductor. The potential on the first conductor, which is Vref at the first end, falls progressively up to the second end, in proportion to the resistance and to the value of the current of the source of added current. The current value of this source is chosen so as to minimize the difference which exists between the various potential differences applied to the elementary circuits.

Finally, here again, it is possible to make provision for the conductor that collects the source currents of the various MOS transistors to have a resistance per unit of length that is not constant along the succession of elementary circuits, and more precisely an elementary section resistance which increases (therefore a width that decreases) from the upstream input gradually as the rank j increases from 1 to N. The law of decrease preferably comes close to a function $(N-j)/N-j+1)$ as a function of the rank j of the section of conductor concerned.

In all these configurations, the first conductor supplying the lowest current to the elementary circuits will preferably have less width than the mean width of the second conductor.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein:

FIG. 8 represents another possible physical layout;

FIG. 9 represents a combination of the principle of the invention with a conductor tree-structure principle;

FIG. 10 represents a configuration with a power supply conductor of variable width along the succession of circuits;

DETAILED DESCRIPTION OF THE INVENTION

Figure 3:
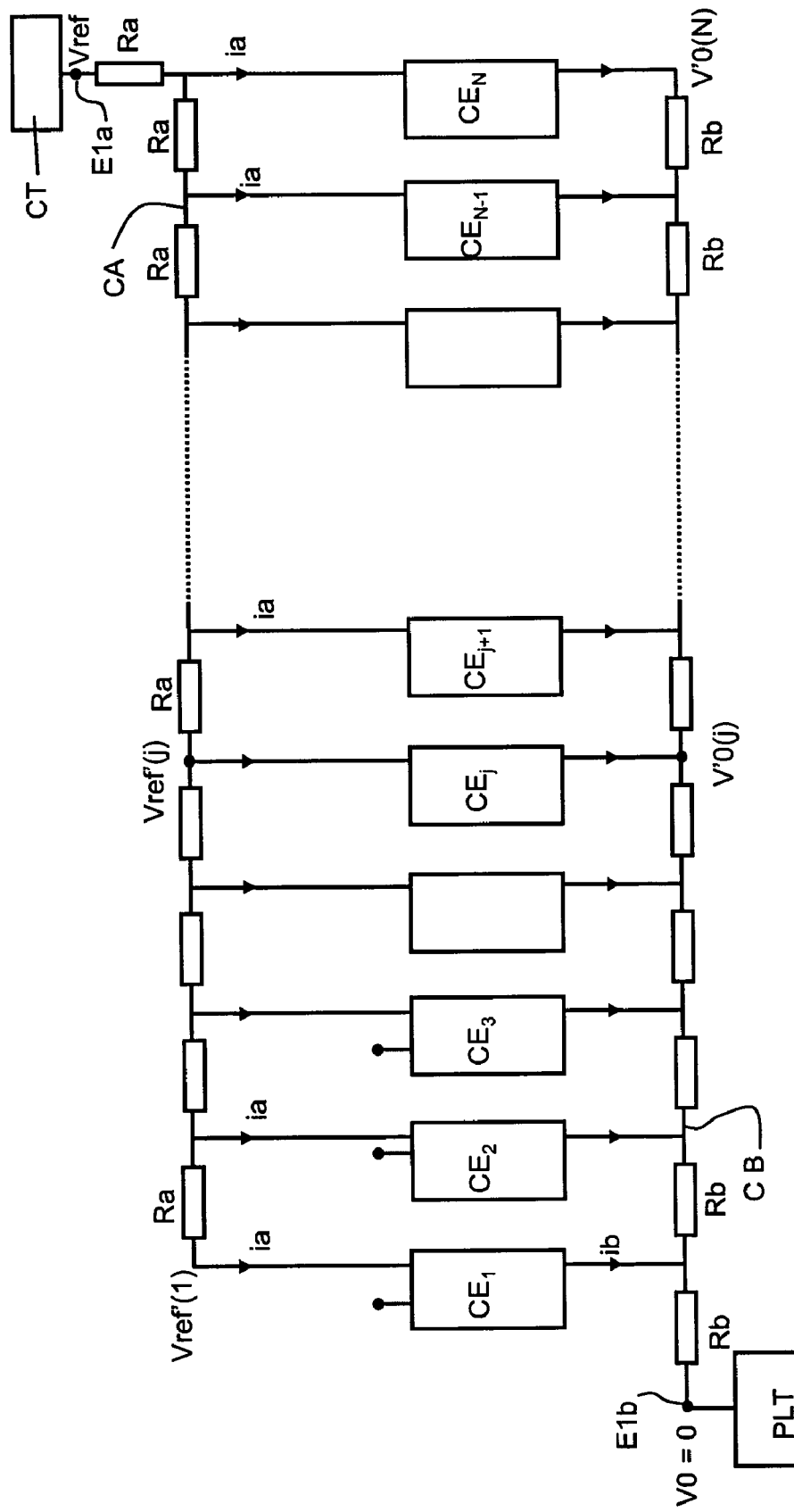
FIG. 3 is an illustration of the schematic diagram of the integrated circuit according to the invention.

FIG. 3 represents the integrated circuit according to the invention, or more precisely the portion of integrated circuit to which the invention relates, the integrated circuit clearly being able to comprise many other elements.

The invention will be described in the context set out above, namely a precision analog-digital or digital-analog converter capable of delivering a digital value coded on 12 or 14 bits for each value of analog voltage applied to the input of the converter. The converter uses many series of current sources which are all identical; each source may consist of a transistor having its emitter (or its source) connected to a conductor which is connected to a ground potential V0, with or without emitter resistance, and its base (or its gate) connected to a conductor connected to a reference potential Vref. The invention can be applied to other integrated circuits in which the problem arises of applying a potential difference Vref–V0 to a series of many elementary circuits which, as much as possible must all receive the same potential difference.

The circuit of FIG. 3 therefore comprises a large number N of identical elementary circuits that are placed next to one another and indicated by the references $CE_1$, $CE_2$, ... $CE_{j+1}$, $CE_{N-1}$, $CE_N$.

N is equal to at least 20 but the main focus is on the circuits in which N is greater than fifty because it is these circuits that will pose the most problems. Each elementary circuit has been represented symbolically with three terminals, two of them being intended to receive two reference potentials which should be strictly identical for all the circuits. The third terminal is used, for example, to draw current from a differential pair not shown forming part of a comparator or of a differential amplifier; because of the identity of the various elementary circuits, the current drawn by this third terminal is identical for all the elementary circuits because the two potentials received respectively on the first two terminals are identical. It is this identity of currents on the third terminal that is sought.

One of the reference potentials, Vref, is applied to a first terminal by a first conductor CA; the other reference potential, V0, is applied to the second terminal by a second conductor CB. The first terminal consumes a current ia, identical for all the circuits, for example the current consumed by the base of a bipolar transistor. The second terminal supplies or consumes a current ib, identical for all the circuits; it is, for example, the current delivered by the emitter or the source of the transistor.

In this example, the first reference potential Vref is generated by a circuit CT which forms part of the integrated circuit, and the second reference potential V0 is one of the power supply potentials of the integrated circuit, in this instance the ground potential, obtained for example on a conductive land PLT serving as the connection of the integrated circuit with the outside. It will be understood that the invention applies just as well if the two reference potentials have another origin, including if one of the potentials is a variable potential to be measured.

The first conductor CA is connected, at a point that will be called the upstream input E1a of this conductor, to the circuit CT, and it can be considered that the circuit CT supplies a potential Vref at this point; the conductor CA extends from this upstream input E1a all along the succession of elementary circuits.

The second conductor CB is connected, at a point that will be called the upstream input E1b of this conductor, to the land PLT, and it can be considered that the land PLT supplies a ground potential V0 at this point; the conductor CB extends from this upstream input E1b all along the succession of elementary circuits.

According to the invention, the upstream input E1b of the conductor CB is situated immediately next to the first elementary circuit $CE_1$ of rank 1 and the conductor CB then extends along the succession of circuits in the order of the ranks j increasing from 1 to N, while the upstream input E1a of the conductor CA is situated immediately next to the last elementary circuit $CE_N$ of rank N and the conductor CA then extends along the succession in the order of the ranks j decreasing from N to 1.

It is therefore understood that the land PLT and the circuit CT are placed respectively on either side of the succession of elementary circuits.

Figure 1:
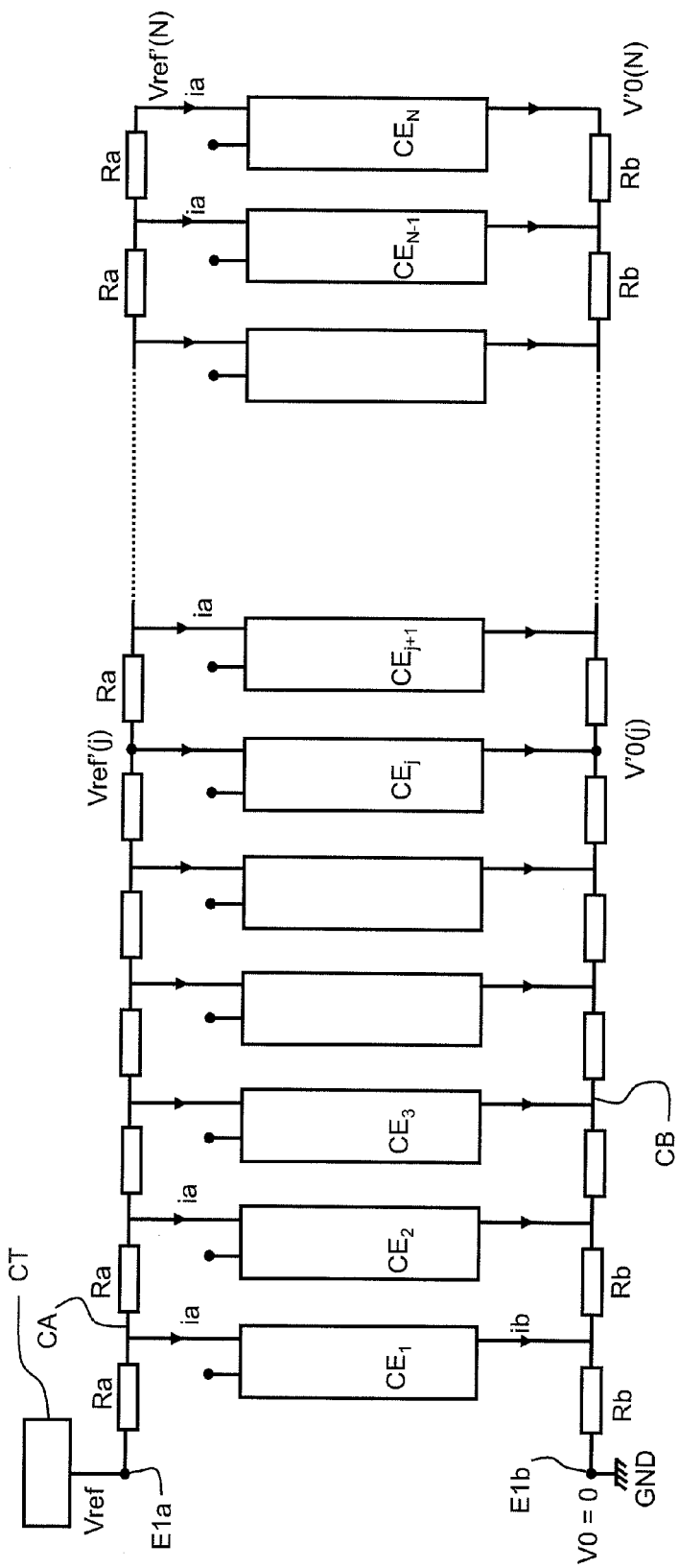
FIG. 1 illustrates an integrated circuit comprising a large number of elementary circuits that are juxtaposed and must all receive the voltage Vref that is present on a first conductor CA and the voltage V0 that is present on a second conductor CB connected to ground GND.
Figure 4:
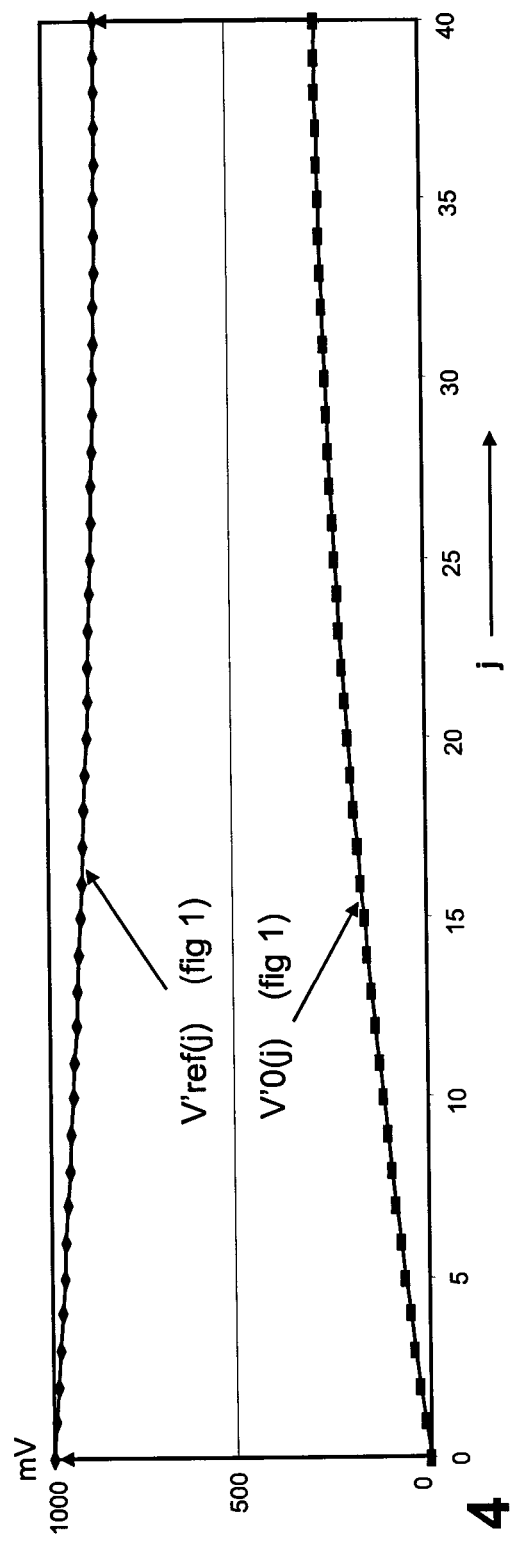
FIG. 4 is an example of variation of potential along the conductor CA and along the conductor CB of FIG. 1.

FIG. 4 represents curves of variation of the two potentials V'ref(j) and V'0(j) really applied to the elementary circuits of the succession (instead of Vref and V0), as a function of j, when the configuration is that of FIG. 1. The first reference potential V'ref(j) decreases steadily from Vref as the rank j (on the X-axis) increases. The second reference potential V'0(j) increases steadily with the rank j from V0. In order to simplify the representation, curves have been produced for N=40, the principle remaining the same when N is higher.

Figure 5:
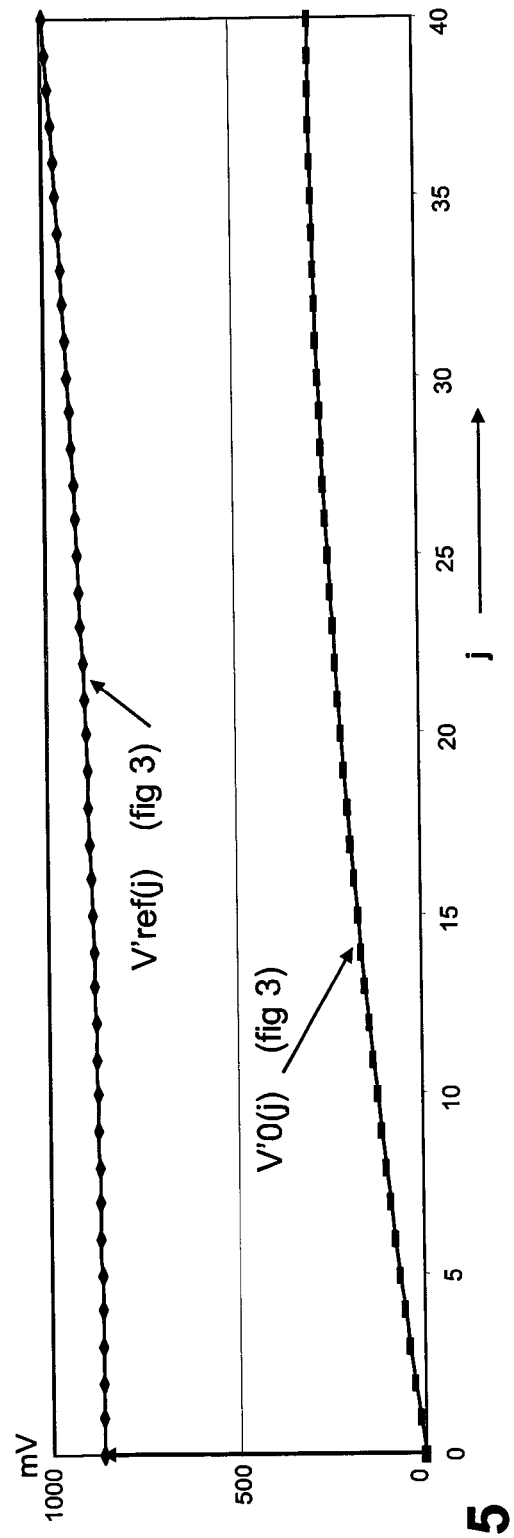
FIG. 5 represents an example of variation of potential along the conductors CA and CB of the circuit of FIG. 2.

FIG. 5 represents the corresponding curves V'ref(j) and V0 when the configuration of the integrated circuit is that of FIG. 3. The first potential V'ref increases progressively with the rank j. The second reference potential V0 increases steadily as in FIG. 4.

Figure 6:
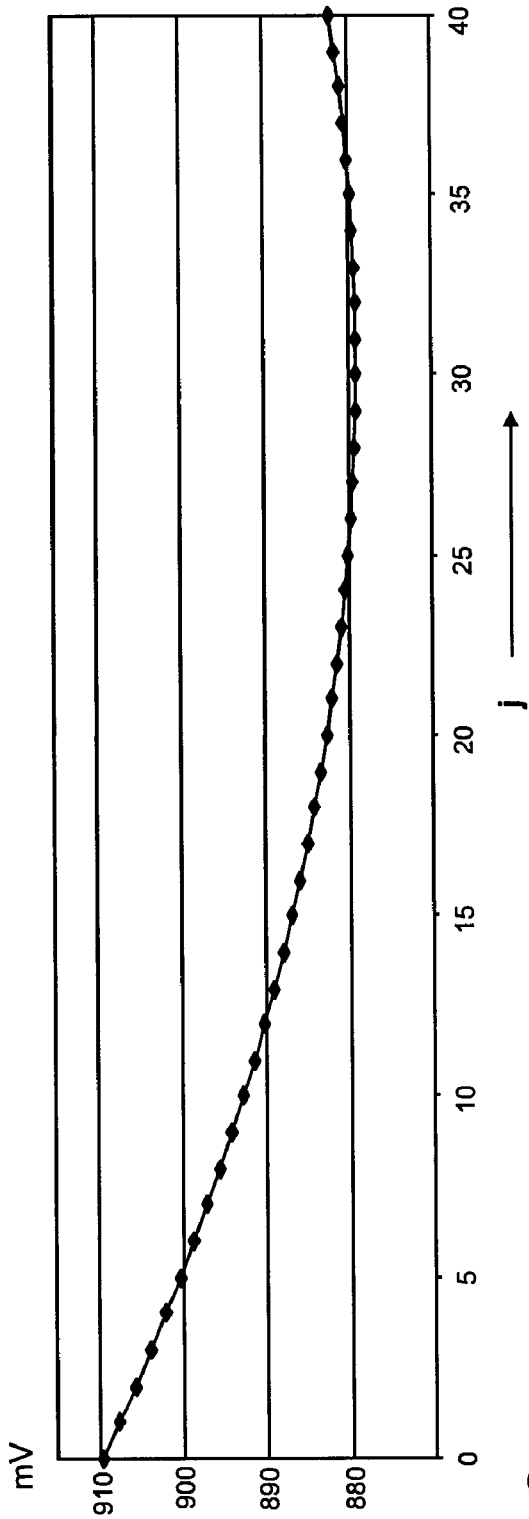
FIG. 6 represents the variation of the potential difference along the succession of elementary circuits between the conductor CA and the conductor CB in the case of FIG. 3.

FIG. 6 shows the potential difference between V'ref and V'0. The scale is expanded and offset on the Y-axis so as to better show the shape of the variation with the rank j: the potential difference varies, but the top limit is lower than it was in the case of the configuration of FIG. 1, and the bottom limit is not lower than it was in the configuration of FIG. 1. In total, the potential difference is therefore more constant along the succession of elementary circuits than it was with the configuration of FIG. 1.

In the case of FIG. 1, it should also be noted that there was every advantage in minimizing the linear resistance (resistance per unit of length) of the first conductor CA and that of the second conductor CB; specifically, the potential difference became more constant when the resistance of the first conductor and the resistance of the second conductor were lower.

Figure 2:
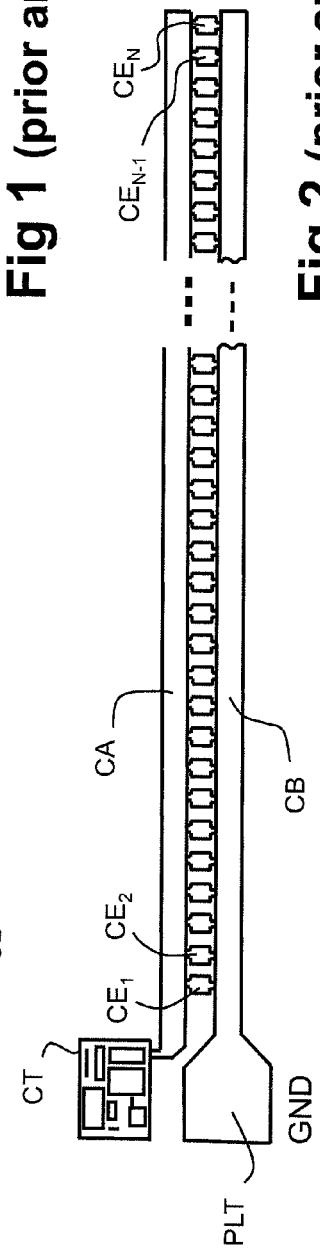
FIG. 2 illustrates a possible physical layout of the circuit of FIG. 1.

In contrast, with the configuration of FIG. 2, provision is preferably made for the linear resistance of the first conductor to be much greater than the linear resistance of the second conductor and for this to be so in the ratio of the currents ib and ia.

Therefore, for example, when the elementary circuit comprises essentially a transistor absorbing a base current ia and producing an emitter current ib, it will be preferable to choose linear resistances in a ratio Ra/Rb equal to the gain in beta current of the transistor, namely a value from approximately 20 to 500 or preferably from 100 to 250 (this value depends on the production technology of the transistors).

By the calculation, it is noted and verified that, by choosing a ratio Ra/Rb of the resistances of the elementary sections that is substantially equal to the ratio of currents ib/ia consumed by an elementary circuit from the conductors CB and CA, the variation in the potential differences is minimized along the succession of N elementary circuits.

It can be decided to produce the conductive strip of the conductor CB in aluminum or in copper (highly conductive materials) and the conductive band of the conductor CA of polycrystalline silicon or titanium nitride or tantalum nitride or tungsten, or another material that is much less conductive than aluminum; the thicknesses of the layers will also be varied and different widths will be selected for the conductors CA and CB, the conductor CA being narrower than the conductor CB. For example, if the current gain of the transistors is equal to 200, it is possible to give the conductors CA and CB respective widths of 1.5 and 30 micrometers, while producing the conductor CB of aluminum and the conductor CA of a material with resistance per square 10 times higher than that of the conductor CB (for example of polycrystalline silicon or titanium nitride of appropriate thickness).

It is therefore understood that, contrary to the prior art, no effort is being made to minimize the linear resistance of the two conductors because that results in widths that are too great when N is very large, but one of the linear resistances is judiciously adapted as a function of the other.

Figure 7:
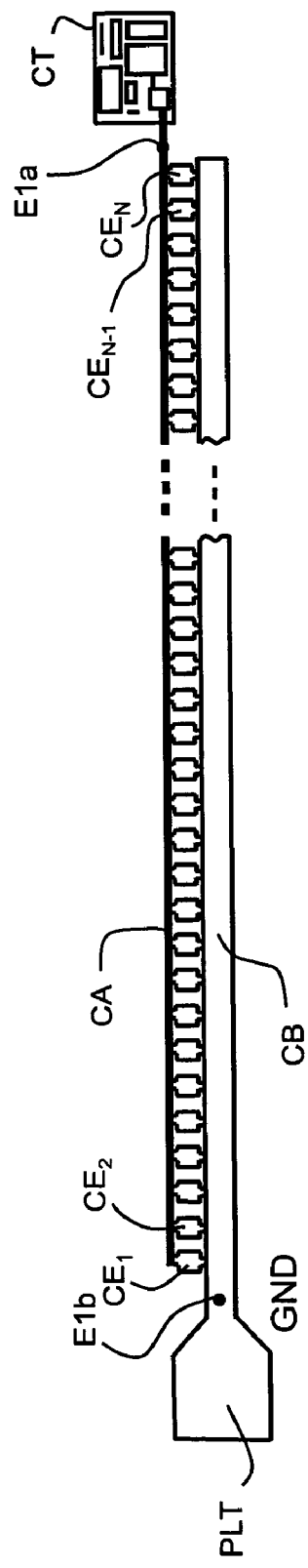
FIG. 7 represents an example of the real physical layout of the integrated circuit according to the invention.

FIG. 7 shows in a physically realistic manner a way of producing the integrated circuit according to the invention. It can be seen that the conductive strip forming the conductor CA, which leaves the circuit CT, is much narrower than that of the conductor CB which leaves the conductive land PLT. The land is placed on the side of the elementary circuit of rank 1; the voltage reference circuit CT is placed on the other side of the succession, that is to say on the side of the elementary circuit of rank N.

It will be noted that the succession of juxtaposed elementary circuits is not necessarily in a straight line: it can be folded on two or three or four sides, as shown in FIG. 8. In these folded configurations, the upstream input E1b of the conductor CB is again situated on the side of the elementary circuit $CE_1$ of rank 1 and is directly connected to the land PLT, while the upstream input E1a of the conductor CA, situated on the side of the elementary circuit $CE_N$ of rank N is connected to the circuit CT.

If the elementary circuits are particularly numerous, it is also possible to envisage partially tree-structured configurations, by dividing, for example, the succession of elementary circuits. FIG. 9 shows, as an example, a configuration with two branches that are of particular use if there are two power supply lands PLT and PLT' at the same potential V0.

There are then two series of symmetrical elementary circuits $CE_1$, $CE_2$, up to $CE_N$ etc. for the first succession, $CE'_1$, $CE'_2$, etc. up to $CE'_N$ for the second. They are turned in the reverse direction relative to one another, the rank j increasing from left to right for the first succession and from right to left for the second. The circuits of rank N of the two successions are therefore close to one another; the reference circuit CT is placed geographically close to these two elementary circuits of rank N, and the conductors CA and CA' power the successions in the order of the decreasing ranks j, beginning with the circuits of rank N.

Connected respectively to each conductive land PLT, PLT' are the upstream input E1b of a conductor CB which runs alongside the first succession of elementary circuits and the upstream input of a conductor CB' which runs alongside the second succession. These first ends power the succession in the order of the increasing ranks j, beginning with the elementary circuits of rank 1.

To further increase the constancy of the potential difference along the succession of elementary circuits in all these configurations, it is also possible to provide a variable width for the widest conductive strip (that which is followed by the strongest current, the strip forming the conductor CB in the examples given hitherto). The two conductive strips CA and CB could moreover have variable widths, but if a much narrower width has been adopted for the conductor CA because of the high ratio ib/ia, that is to say because of the current gain of the transistor, it is scarcely possible in practice to vary the width of this conductor because the idea in practice is to minimize it.

As is shown in FIG. 5, the variation in potential in the conductor CB does not follow a curve parallel to the variation in potential in the conductor CA. The choice of a variable width of the conductor CB makes it possible to produce another curve of variation in potential along the conductor CB, as parallel as possible to the curve of variation along the conductor CA. Specifically, the more parallel the curves, the more constant the potential difference along the succession.

Obtaining parallel curves is based on the following calculation: action is taken to ensure that the section of conductor CA of rank j produces the same elementary voltage drop as the section of the same rank of the conductor CB. The section of conductor CA of rank j is followed by a current (N−j)ia and the section of conductor CB of the same rank is followed by a current (j+1)ib. Knowing the ratio between the elementary currents ia and ib, a ratio of elementary resistances is deduced to be given to the opposite sections.

If the conductor CA has a constant width, the calculation shows that it is necessary to give the conductor CB a variable width such that the section of rank j, which connects the elementary circuits of rank j−1 and j, has a width proportional to (N−j+1)/j in order to result in parallel variation curves for the two conductors, hence a minimization of the error in potential difference along the succession.

The variation in width as (N−j+1)/j is a theoretically optimal law. However, it results in different widths for each rank j. It is possible to approximate this law by modifying the width of the conductive strip in a discontinuous manner with a longer pitch of width change than the pitch of distribution of the elementary circuits. For example, it is possible to modify the width with a pitch that is a multiple of the pitch of distribution of the circuits.

Moreover, it should be understood that this optimal law gives a width of strip N times larger at the beginning of the succession (j=1) than at the end of the succession (j=N). It is possible to be restricted in minimum width as in maximum width for reasons of design on the one hand and space requirement on the other. For example, it is possible to consider that the minimum width is one micrometer and that the maximum width is 30 micrometers. In this case, it is possible to adopt various approximation solutions:
- it is possible to begin with a maximum width of 30 micrometers at the beginning (rank 1) of the succession, and an approximation of the ideal curve will be made while retaining for the last elementary circuits a minimum constant width of 1 micrometer instead of reducing it below a micrometer as the ideal curve would wish;
- it is also possible to approximate the curve while retaining a maximum width of 30 micrometers for some of the first elementary circuits and by continuing the curve of decrease up to the last rank j=N;
- it is also possible to approximate the curve by having both a constant maximum width of 30 micrometers for a few elementary circuits at the beginning of the succession and a minimum width of 1 micrometer for a few circuits at the end of the succession;
- it is possible to achieve a variation according to the function indicated above on the one hand by beginning with a maximum width at the beginning of the succession and on the other hand by beginning with a minimum width at the end of the succession, while connecting these two functions, for example, by a series of central sections of constant width or of variable widths according to a different function making it possible to make this connection progressively;
- finally, it is possible also to use a variation in width of the conductor CA, although in small measure because it is narrow enough in principle.

In all of the foregoing, it has been considered that each elementary circuit consumed a current is sufficient to produce a voltage drop along the conductor CA, which is the case when the current is the base current of a bipolar transistor.

But in certain circuits, the current consumed by the elementary circuits is zero or almost zero; this is the case when the conductor CA applies a potential to the gate of an MOS transistor. There is a progressive voltage drop in the conductor CB, but there is no voltage drop in the conductor CA that would partly compensate for that of the conductor CB.

In this case, the proposal according to the invention is to connect to the downstream end of the conductor concerned (conductive CA in this example) a current source of value im which will cause such a progressive voltage drop between the upstream input of the conductor and the downstream end. The choice of the value of the current im is preferably made so as to cause, on the conductor CA, from the elementary circuit of rank N to the elementary circuit of rank 1, a voltage drop which minimizes the potential difference variations between the conductor CA and the conductor CB along the succession of elementary circuits. It is possible to consider that the variation is minimized when the value of the current source im is chosen to be equal to $(Rb/Ra).ib.N/2$.

Figure 11:
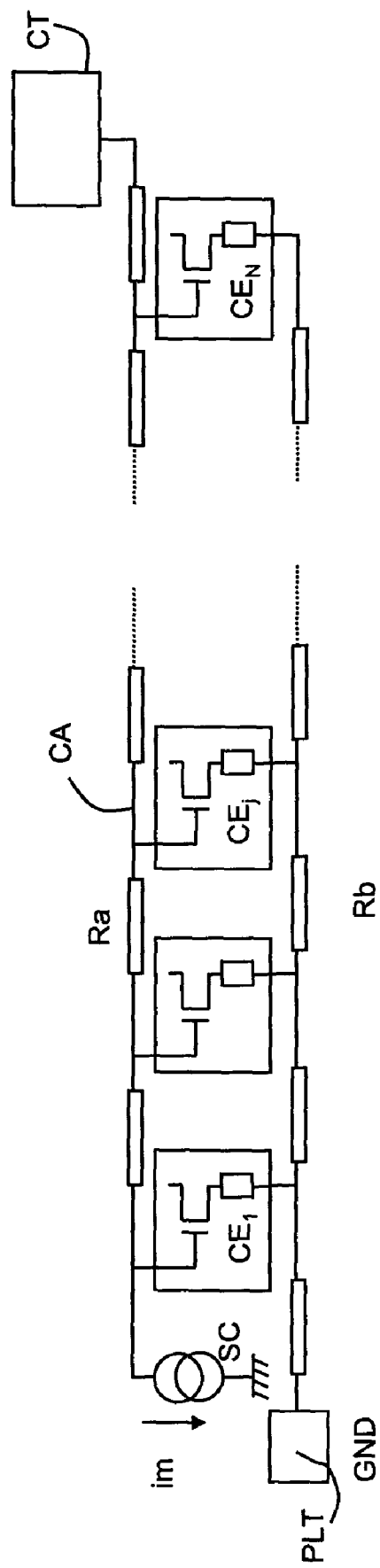
FIG. 11 represents an example of an integrated circuit according to the invention in the situation in which the elementary circuit comprises an MOS transistor and the first conductor CA must supply a bias voltage to the gate of this MOS transistor.

FIG. 11 shows this solution. A current source SC with a value im is placed at the second end of the conductor CA, the first being that which is connected to the voltage reference circuit CT.

A much higher resistance will be chosen for the conductor CA and the lowest possible will be chosen for the conductor CB and deduced therefrom will be the value im of the current source SC to be used. For example, if the conductor CA has a value thirty times lower than the conductor CB and if it is made in the same material as the conductor CB, and if N is equal to 120, the current im must have a value equal to 2ib.

The voltage drop in the conductor CA does not have a parabolic shape as was the case in FIG. 5, but a linear shape since the totality of the current im enters each of the sections of conductor CA. However, the voltage drop in the conductor CB is not linear but parabolic. There is therefore a variable error along the succession of elementary circuits.

To further improve the constancy of the potential difference along the two conductors, it is proposed to compensate for this error by giving the conductor CB a configuration with a variable width, reducing gradually with the succession of circuits from rank 1 to rank N. The progressive variation in width is calculated in order to linearize the variation in potential in the conductor CB and to give it the same gradient as the linear variation on the conductor CA.

This is achieved by giving the section of rank j+1, drawing the current ib of the elementary circuit of rank j+1, a resistance which is the ratio $(N-j)/(N-j+1)$ with the resistance of the preceding section of rank j. Therefore, it will be preferable to give the section of rank j+1 a width in the inverse ratio $(N-j+1)/(N-j)$ with the width of the section of rank j.

Here again, the technological constraints will see to it that a variation approximately and not exactly according to this law will be established, for example by changing the width with a pitch of k sections (k>1) and not with a pitch of 1 section. Equally, if it is decided to adopt a minimum width (for example at least one micrometer wide) and/or a maximum width (for example at most 30 micrometers wide), the law of variation will be adapted in order to take account of these constraints while remaining close to the $(N-j)/(N-j+1)$ law.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. An integrated circuit comprising a succession of N identical elementary circuits, juxtaposed in the order of their rank j varying from 1 to N, N being at least equal to 20 and preferably greater than 50, all connected to a first conductor which is connected, at an upstream input of the first conductor, to a first reference potential and which extends from this upstream input along the succession of elementary circuits, and all furthermore connected to a second conductor which is connected, at an upstream input of the second conductor, to a second reference potential, and which extends from this upstream input of the second conductor along the succession of elementary circuits, wherein the upstream input of the second conductor is situated geographically on the side of the rank 1 of the succession of juxtaposed circuits, and the upstream input of the first conductor is situated geographically on the side of the rank N of the succession of juxtaposed circuits.

2. The integrated circuit as claimed in claim 1, wherein the resistance of an elementary section of the first conductor between two adjacent elementary circuits is in a beta ratio with the resistance Ra of an elementary section of the second conductor between two adjacent elementary circuits, the beta ratio being the ratio between the current drawn by the second conductor from an elementary circuit and the current drawn from the first conductor by the elementary circuit when the first and second reference potentials are applied respectively to the first and second conductors.

3. The integrated circuit as claimed in claim 2, wherein the ratio of resistances ranges between 20 and 500, preferably between 100 and 250.

4. The integrated circuit as claimed in claim 1, wherein the first conductor has a constant width and the second conductor has a variable width decreasing progressively from its upstream input.

5. The integrated circuit as claimed in claim 4, wherein the decrease of said variable width is proportional to $(N-j+1)/j$ general form where j is the rank j of the elementary section of second conductor which connects the elementary circuit of rank j−1 to the elementary circuit of rank j.

6. The integrated circuit as claimed in claim 1, wherein the elementary circuits consume a zero current from the first conductor, and wherein said first conductor extends along the succession of elementary circuits between its upstream input and a downstream end, a current source drawing a current from this conductor being connected to this downstream end.

7. The integrated circuit as claimed in claim 6, wherein the current of the current source has a value im such that $$im=(Rb/Ra).ib.(N/2),$$

where Ra is the resistance of an elementary section of first conductor between two adjacent elementary circuits, Rb is the resistance of an elementary section of second conductor between two adjacent elementary circuits, and ib is the current drawn from an elementary circuit by the second conductor when the first and second reference potentials are applied respectively to the first and second conductors.

8. The integrated circuit as claimed in claim 6, wherein the second conductor has a resistance per unit of length that varies along the succession and a width decreasing progressively from its upstream input.

9. The integrated circuit as claimed in claim 8, wherein the decrease of said variable width is proportional to $(N-j)/(N-j+1)$ where j is the rank of the elementary section of second conductor which connects the elementary circuit of rank j−1 to the elementary circuit of rank j.

10. The integrated circuit as claimed in claim 1, wherein the first conductor is made of a material of which the resistance per square is higher than that of the material of the second conductor.

11. The integrated circuit as claimed in claim 1, wherein the first conductor is narrower than a mean width of the second conductor.

12. The integrated circuit as claimed in claim 7, wherein the first conductor is made of a material of which the resistance per square is higher than that of the material of the second conductor.

13. The integrated circuit as claimed in claim 9, wherein the first conductor is narrower than the mean width of the second conductor.

14. The integrated circuit as claimed in claim 2, wherein the first conductor is made of a material of which the resistance per square is higher than that of the material of the second conductor.

15. The integrated circuit as claimed in claim 4, wherein the first conductor is made of a material of which the resistance per square is higher than that of the material of the second conductor.

16. The integrated circuit as claimed in claim 7, wherein the first conductor is made of a material of which the resistance per square is higher than that of the material of the second conductor.

17. The integrated circuit as claimed in claim 9, wherein the first conductor is made of a material of which the resistance per square is higher than that of the material of the second conductor.

18. The integrated circuit as claimed in claim 7, wherein the first conductor is narrower than a mean width of the second conductor.

* * * * *